(12) United States Patent
Romanov et al.

(10) Patent No.: US 10,840,893 B2
(45) Date of Patent: Nov. 17, 2020

(54) APPARATUS FOR GENERATING HIGH PULSE VOLTAGE

(71) Applicant: Drive CJSC, Novosibirsk (RU)

(72) Inventors: Yuriy I. Romanov, Novosibirsk (RU); Stanislav V. Maletskiy, Novosibirsk (RU)

(73) Assignee: Drive CJSC, Novosibirsk (RU)

( * ) Notice: Subject to any disclaimer, the term of this patent is extended or adjusted under 35 U.S.C. 154(b) by 0 days.

(21) Appl. No.: 16/314,441

(22) PCT Filed: Apr. 24, 2017

(86) PCT No.: PCT/RU2017/000256
§ 371 (c)(1),
(2) Date: Dec. 30, 2018

(87) PCT Pub. No.: WO2018/199788
PCT Pub. Date: Nov. 1, 2018

(65) Prior Publication Data
US 2020/0044633 A1 Feb. 6, 2020

(51) Int. Cl.
| | |
|---|---|
| H03K 3/02 | (2006.01) |
| H03K 3/57 | (2006.01) |
| H02M 1/44 | (2007.01) |
| H02M 3/335 | (2006.01) |
| H03K 3/356 | (2006.01) |
| H02M 1/00 | (2006.01) |

(52) U.S. Cl.
CPC ............ *H03K 3/57* (2013.01); *H02M 1/44* (2013.01); *H02M 3/33507* (2013.01); *H03K 3/02* (2013.01); *H03K 3/356008* (2013.01); *H02M 2001/0006* (2013.01)

(58) Field of Classification Search
CPC .................................. H03K 3/02; H03K 3/57
USPC .................................. 307/112, 125, 126, 130
See application file for complete search history.

(56) References Cited

U.S. PATENT DOCUMENTS

| | | | |
|---|---|---|---|
| 2011/0305048 A1 | 12/2011 | Yang et al. | |
| 2019/0165682 A1* | 5/2019 | Romanov | H02M 1/08 |
| 2019/0165690 A1* | 5/2019 | Romanov | H03K 3/53 |

OTHER PUBLICATIONS

AN6920MR Integrated Critical-Mode PFC/Quasi-Resonant Current-Mode PWM Controller FAN6920—fairchildsemi.com/application-notes/AN/AN-6920MR.pdf, Feb. 22, 2013.

* cited by examiner

*Primary Examiner* — Adi Amrany
(74) *Attorney, Agent, or Firm* — Patentagar PLLC; Alexander Rabinovich

(57) ABSTRACT

Apparatus for generating high pulse voltage comprises a high DC voltage source, a low DC voltage source, an inductive load, two controllable gates, a controllable switch and, connected in series, a capacitor, a booster diode and an additional controllable switch, as well as a controllable pulse duration converter for pulses from a rectangular pulse generator. The preceding connection of the booster diode anode with the negative terminal of the low DC voltage source ensured by the pulse duration converter and second controllable switch correlates the booster diode switching time with the moment of closing the both controllable gates. Thus, the pulse noise present in the prior art designs is eliminated, and the level of interference emitted into the surroundings is decreased.

2 Claims, 2 Drawing Sheets

US 10,840,893 B2

APPARATUS FOR GENERATING HIGH PULSE VOLTAGE

CROSS-REFERENCE TO RELATED APPLICATIONS

This application is a U.S. National phase application of International application PCT/RU2017/000256 filed on Apr. 24, 2017, the International application being hereby incorporated by reference in its entirety.

BACKGROUND OF THE INVENTION

1. Field of the Invention

The proposed design relates to electrical engineering and can be used for providing pulse power supply with irreducible level of electromagnetic interference (pulse noise) radiated into the surrounding environment.

2. Description of the Related Art

Known have been similar designs, see US20110305048A1 published Dec. 15, 2011, comprising the following aggregation of features:
high DC voltage source (HDCVS);
a first (storage) capacitor connected by one (first) plate thereof to a positive terminal of the HDCVS and connected by another (second) plate thereof to a negative terminal of the HDCVS;
a first controllable gate;
an inductive load (made as a primary winding of a transformer, a secondary winding thereof being connected to a rectifier);
a second controllable gate;
a low DC voltage source (LDCVS) (including a third winding of the transformer, a rectifying diode and a filtering capacitor) connected by a negative terminal thereof to the negative terminal of the HDCVS;
a control circuit connected by a first input thereof to a control input of the second controllable gate and connected by power inputs thereof to respective terminals of the LDCVS;
a first (booster) diode connected by anode thereof to a positive terminal of the LDCVS;
a second (booster) capacitor connected by one (first) plate thereof to a cathode of the first diode;
a second diode;
a third diode;
a controllable switch connected: by a first input thereof to the first plate of the second (booster) capacitor, by a second input thereof to a second plate of the second (booster) capacitor, by an output thereof to a control input of the first controllable gate, and by a control input thereof to a second output of the control circuit;
a third (blocking) capacitor connected by one (first) plate thereof to the positive terminal of the HDCVS and by another (second) plate thereof to a first terminal of the first controllable gate;
a second terminal of the first controllable gate being connected to a second plate of the second capacitor, a first terminal of the inductive load being connected to the positive terminal of the HDCVS, a second terminal of the inductive load being connected to a first terminal of the second controllable gate, a second terminal of the second controllable gate being connected to the negative terminal of the HDCVS, anode of the second diode being connected to the first terminal of the second controllable gate, a cathode of the second diode being connected to the first terminal of the first controllable gate, anode of the third diode being connected to the negative terminal of the HDCVS, and a cathode of the third diode being connected to the anode of the second diode.

Common features of the above-identified analog and the proposed design are
the HDCVS;
the first (storage) capacitor connected by one (the first) plate thereof to the positive terminal of the HDCVS and by the other (the second) plate thereof to the negative terminal of the HDCVS;
the first controllable gate;
the inductive load;
the second controllable gate;
the LDCVS connected by a negative terminal thereof to the negative terminal of the HDCVS;
the first diode;
the second capacitor connected by one (the first) plate thereof to the cathode of the first diode;
the second diode;
the third diode;
the controllable switch connected: by the first input thereof to the first plate of the second capacitor, by the second input thereof to the second plate of the second capacitor, by the output thereof to the control input of the first controllable gate;
the second terminal of the first controllable gate being connected to the second plate of the second capacitor, the anode of the second diode being connected to the first terminal of the second controllable gate, the anode of the third diode being connected to the negative terminal of the HDCVS, and the second terminal of the inductive load being connected to the first terminal of the second controllable gate.

In "AN6920MR Integrated Critical-Mode PFC/Quasi-Resonant Current-Mode PWM Controller FAN6920" (fairchildsemi.com/application-notes/AN/AN-6920MR.pdf, Feb. 22, 2013), another design has been disclosed which is believed to be the closest analog (prototype) of the proposed design and which comprises the following aggregation of features:
a HDCVS;
a first (storage) capacitor connected by a (first) plate thereof to a positive terminal of the HDCVS and connected by another (second) plate thereof to a negative terminal of the HDCVS;
a first controllable gate connected by a first terminal thereof to the positive terminal of the HDCBS;
an inductive load (made as a primary winding of a transformer, a secondary winding thereof being connected to a rectifier);
a second controllable gate connected by a first terminal thereof to a second terminal of the inductive load;
a limiting resistor connected by one terminal thereof to a second terminal of the second controllable gate and connected by another terminal thereof to the negative terminal of the HDCVS;
a LDCVS (including a third winding of the transformer, a rectifying diode and a filtering capacitor) connected by a negative terminal thereof to the negative terminal of the HDCVS;
a square wave generator connected by an output thereof via a buffer matching stage to a control input of the second controllable gate and connected by power inputs thereof to respective terminals of the LDCBS;

a first (booster) diode connected by anode thereof to a positive terminal of the LDCVS;

a second (booster) capacitor connected by a first plate thereof to a cathode of the first (booster) diode and connected by a second plate thereof to a second terminal of the first controllable gate;

a second (first pick-off) diode connected by a cathode thereof to a first terminal of the inductive load and connected by anode thereof to the negative terminal of the HDCVS;

a third (second pick-off) diode connected by anode thereof to the second terminal of the inductive load and connected by a cathode thereof to the positive terminal of the HDCVS;

a controllable switch connected: by a first input thereof to the first plate of the second (booster) capacitor, by a second input thereof to a second plate of the second (booster) capacitor, by an output thereof to a control input of the first controllable gate, and by a control input thereof to the output of the square wave generator.

Common features of the proposed design and the prototype are:

the HDCVS;

the first capacitor connected by the first plate thereof to the positive terminal of the HDCVS and connected by the second plate thereof to the negative terminal of the HDCVS;

the first controllable gate connected by the first terminal thereof to the positive terminal of the HDCVS;

the inductive load connected by the first terminal thereof to the second terminal of the first controllable gate;

the second controllable gate connected by the first terminal thereof to the second terminal of the inductive load;

the limiting resistor connected by one terminal thereof to the second terminal of the second controllable gate and connected by the other terminal thereof to the negative terminal of the HDCVS;

the LDCVS connected by the negative terminal thereof to the negative terminal of the HDCVS;

the square wave generator connected by the output thereof via the buffer matching stage to the control input of the second controllable gate and connected by the power inputs thereof to respective terminals of the LDCVS;

a first diode;

the second capacitor connected by the first plate thereof to the cathode of the first diode and connected by the second plate thereof to the second terminal of the first controllable gate;

the second diode connected by the cathode thereof to the first terminal of the inductive load and connected by the anode thereof to the negative terminal of the HDCVS;

a third diode connected by the anode thereof to the second terminal of the inductive load and connected by the cathode thereof to the positive terminal of the HDCVS;

the controllable switch connected: by the first input thereof to the first plate of the second capacitor, by the second input thereof to the second plate of the second capacitor, by the output thereof to the control input of the first controllable gate, and by the control input thereof to the output of the square wave generator.

SUMMARY OF THE INVENTION

The technical result, which cannot be achieved by either of the above-discussed prior art designs, lies in the decreasing of the level of pulse electromagnetic interference radiated by the prior art designs for generating high pulse voltage due to the transit time of nonlinear elements (the booster diode connected to the booster capacitor, to begin with).

Pulse electromagnetic interference generated in the prior art designs prevent radio electronic apparatuses located nearby from functioning properly and negatively affect operability thereof. It is a great obstacle for fulfilling requirements for electromagnetic compatibility, particularly in the systems with distributed power supply that have plurality of pulse power supply units. Additionally, the electromagnetic radiation of pulse noise into surrounding environment deteriorates environmental situation in human environment. Therefore, a pressing need emerged to improve the prior art designs.

The reason for inability of the prior art designs to achieve the above-mentioned technical result lies, first of all, in paying no proper attention to finding means decreasing the level of electromagnetic pulse interference radiated into the surrounding environment.

With the character and analysis of the prior art designs in view, it may be concluded that providing apparatuses for generating high pulse voltage that secure decreasing the level of pulse electromagnetic noise radiated into the surrounding environment is relevant up to date.

In a proposed apparatus for generating high pulse voltage comprising an HDCVS, a first (storage) capacitor connected by one (a first) plate thereof to a positive terminal of the HDCVS and connected by another (a second) plate thereof to a negative terminal of the HDCVS, a first controllable gate connected by a first terminal thereof to the positive terminal of the HDCVS, an inductive load connected by a first terminal thereof to a second terminal of the first controllable gate, a second controllable gate connected by a first terminal thereof to a second terminal of the inductive load, a limiting resistor connected by one terminal thereof to a second terminal of the second controllable gate and connected by another terminal thereof to the negative terminal of the HDCVS, a LDCVS connected by a negative terminal thereof to the negative terminal of the HDCVS, a square wave generator connected by an output thereof via a buffer matching stage to a control input of the second controllable gate and connected by power inputs thereof to respective terminals of the LDCVS, a first (booster) diode, a second (booster) capacitor connected by a first plate thereof to a cathode of the first (booster) diode and connected by a second plate thereof to the first terminal of the first controllable gate, a second (first pick-off) diode connected by a cathode thereof to the first terminal of the inductive load and connected by an anode thereof to the negative terminal of the HDCVS, a third (second pick-off) diode connected by an anode thereof to the second terminal of the inductive load and by a cathode thereof to the positive terminal of the HDCVS, a controllable switch connected by a first input thereof to the first plate of the second (booster) capacitor, connected by a second input thereof to the second plate of the second (booster) capacitor, connected by an output thereof to a control input of the first controllable gate, and connected by a control input thereof to the output of the square wave generator, the above-identified technical result is achieved by providing an additional (second) controllable switch and a square pulse duration converter, the square pulse duration converter being connected by an input thereof to the output of the square wave generator and being connected by an output thereof to a control input of the additional (second) controllable switch, the additional (second) controllable switch being connected by a first input thereof to the negative terminal of the LDCVS, and being connected by a second input thereof to the positive terminal of the LDCVS, and being connected by an output thereof to the anode of the first (booster) diode.

Adding the second controllable switch and square pulse duration converter with the above-identified connections thereof enables—by the action of a square pulse coming from the output of the square wave generator via the buffer matching stage to the control input of the second controllable gate—turning on the second controllable gate and enables—by the action of the same square pulse coming from the output of the square wave generator to the square pulse duration converter—generating a converted (additional) square pulse. As the converted (additional) square pulse is applied to the control input of the second controllable switch, the anode of the booster diode becomes connected to the positive terminal of the LDCVS. As it takes place, the booster capacitor is getting charged through the circuit from the positive terminal of the LDCVS, via the second controllable switch, booster diode, booster capacitor, inductive load, closed second controllable gate, and limiting resistor, and to the negative terminal of the LDCVS. The charging results in forming voltage at the booster capacitor plates which is close to the output voltage of the LDCVS.

After the booster capacitor is charged, and under the action of the same square pulse from the output of the square wave generator, the first controllable switch connects the booster capacitor, charged to the voltage close to the output voltage of the LDCVS, to the control input of the first controllable gate. This results in turning on the first controllable gate (almost contemporaneously with the second controllable gate), and current start flowing through the inductive load through the circuit from the positive terminal of the HDCVS, via the closed first controllable gate, the inductive load, the closed second controllable gate, and the limiting resistor to the negative terminal of the HDCVS.

With that, the potential of the first terminal of the inductive load becomes almost equal to the potential of the positive terminal of the HDCVS (because the resistance of the closed first gate is negligible, and the voltage drop across it is also negligible), whereas the potential of the second terminal of the inductive load becomes almost equal to the potential of the negative terminal of the HDCVS (because the resistance of the closed second gate and limiting resistor are negligible, and the voltage drop across them is also negligible). Therefore, the potential difference between the terminals of the inductive load becomes close to the output voltage of the HDCVS.

At that moment, energy storing takes place in the inductive load (forward stroke).

After the square pulse at the output of the square wave generator ends, both controllable gates open. At that moment, the potential difference between terminals of the inductive load changes its sign, and the stored energy is transferred to the effective load (back stroke). Thus, conversion of the high DC voltage into pulse voltage takes the place fulfilling the intended use of the proposed apparatus.

It should be especially noted that in prior art, as the first and second controllable gates close and a high potential at the first terminal of the inductive load emerges, this potential turns out to be applied via the booster capacitor to the cathode of the booster diode. At that, because of the transit time of the non-linear element (diode), in-rush current starts flowing through the non-linear element (diode) giving rise to pulse noise. To prevent that from occurring, the second controlled switch and square pulse duration converter, along with connections thereof, are brought into the proposed apparatus.

The parameters of the converted (additional) square pulse are selected to have the trailing edge thereof leading for some time the rising edge of the square pulse coming to the control inputs of the both controllable gates. This time is generally several hundred nanoseconds, depends on the type of the non-linear element (diode), and should be sufficient for the transients in the diode to complete. Thus, closing the booster diode will be secured by the time of closing the both controllable gates because applied to the cathode thereof, while the controllable gates are open, is the positive voltage between the plates of the earlier-charged booster capacitor, which is close to the output voltage of the LDCVS, and the anode thereof is by that time already connected to the negative terminal of the LDCVS via the second controllable switch.

As a result, by the time of the closing of the first and second controllable gates and, accordingly, by the time of creating high potential at the first terminal of the inductive load applied to the cathode of the booster diode, this diode is effectively closed, and the pulse noise, emerging in the known designs upon closing the first and second controllable gates, does not occur in the proposed apparatus. In the known designs, the pulse noise emerges when pulse current flows through the following circuit: the point of connection of the second terminal of the first controlled gate and the first terminal of the inductive load—the booster capacitor—the booster diode, closing, but not closed yet,—the positive terminal of the LDCVS—the negative terminal of the LDCVS—the negative terminal of the HDCVS—the positive terminal of the HDCVS—the closed first controllable gate. In the proposed design, the above-identified circuit of pulse current flowing gets broken beforehand due to the preceding connection of the second input of the second controllable switch (and, consequently, of the anode of the booster diode) with the negative terminal of the LDCVS.

The above-discussed effect of the emerging of the pulse noise in the prior art designs is of sufficiently generic character because high voltage diode switching time ($\tau_{diode}$) is in principle more than switching time of modern power semiconductor elements. Therefore, the preceding connection of the booster diode anode with the negative terminal of the LDCVS (by means of the added square pulse duration converter, second controllable switch and connections thereof) used in the proposed design is specifically intended to correlate the booster diode switching time with the moment of closing the both controllable gates so as to eliminate the pulse noise, which is present in the prior art designs.

This results in decreasing the level of pulse noise radiated into the surrounding environment, in improving electromagnetic compatibility of electronic units of various purpose and environmental situation in human environment, and, thus, in achieving the above technical result.

Analysis performed among known designs showed that none of them comprises either the whole aggregation of the essential features of the proposed solution or its distinguishing (characterizing) features, thus permitting the conclusion about novelty of, and inventive step in, the design.

BRIEF DESCRIPTION OF DRAWINGS

The proposed apparatus for generating high pulse voltage explained in the ensuing description and drawings where.

DETAILED DESCRIPTION

Figure 1:
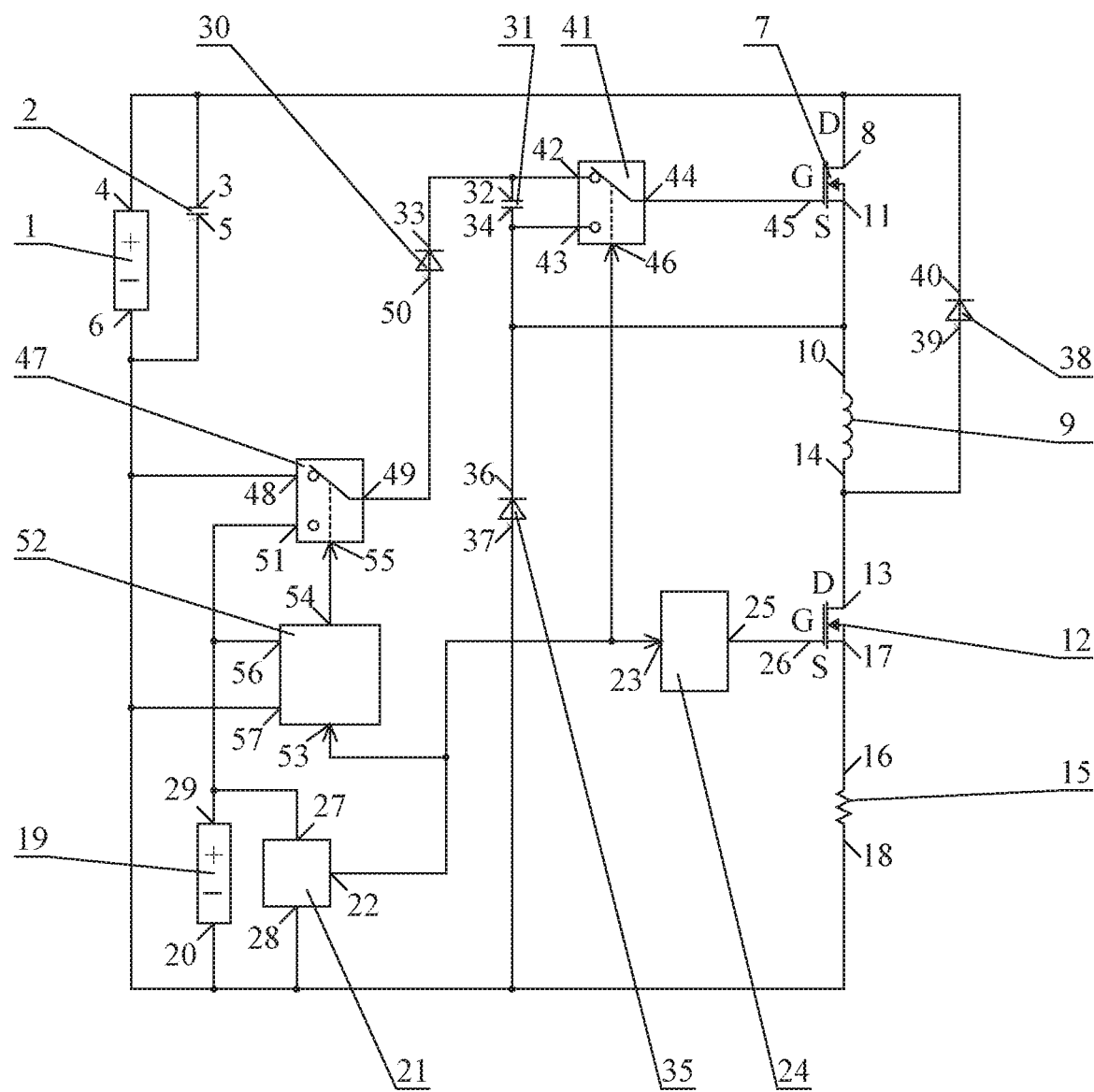
FIG. 1 shows a functional diagram of the apparatus and
FIG. 2 presents voltage charts illustrating the operation of the apparatus.

The proposed apparatus for generating high pulse voltage comprises:
an HDCVS 1;
a first (storage) capacitor 2 connected by one (first) plate 3 thereof to a positive terminal 4 of the HDCVS 1 and connected by another (second) plate 5 thereof to a negative terminal 6 of the HDCVS 1;
a first controllable gate 7 (including, for example, a MOS-transistor) connected by a first terminal 8 (drain of the MOS-transistor) thereof to the positive terminal 4 of the HDCVS 1;
an inductive load 9 connected by one (first) terminal 10 thereof to a second terminal 11 (source of the MOS-transistor) of the first controllable gate 7;
a second controllable gate 12 (including, for example, a MOS-transistor) connected by a first terminal 13 (drain of the MOS-transistor) thereof to a second terminal 14 of the inductive load 9;
a limiting resistor 15 connected by one terminal 16 thereof to another terminal 17 (source of the MOS-transistor) of the second controllable gate 12 and connected by another terminal 18 thereof to the negative terminal 6 of the HDCVS 1;
a LDCVS 19 connected by a negative terminal 20 thereof to the negative terminal 6 of the HDCVS 1;
a square wave generator 21 connected by an output 22 thereof to an input 23 of a buffer matching stage 24, an output 25 of the stage 24 being connected to a control input 26 (gate of the MOS-transistor) of the second controllable gate 12, power inputs 27 and 28 of the square wave generator 21 being connected to output terminals 29 and 20 of the LDCVS 19, respectively;
a first (booster) diode 30;
a second (booster) capacitor 31 connected by a first plate 32 thereof to a cathode 33 of the first diode 30 and connected by a second plate 34 thereof to the second terminal 11 of the first controllable gate 7;
a second (first pick-off) diode 35 connected by a cathode 36 thereof to the first terminal 10 of the inductive load 9 and connected by an anode 37 thereof to the negative terminal 6 of the HDCVS 1;
a third (second pick-off) diode 38 connected by an anode 39 thereof to the second terminal 14 of the inductive load 9 and connected by a cathode 40 thereof to the positive terminal 4 of the HDCVS 1;
a first (main) controllable switch 41 connected by a first input 42 thereof to the first plate 32 of the second capacitor 31, connected by a second input 43 thereof to the second plate 34 of the second capacitor 31, connected by an output 44 to a control input (gate of the MOS-transistor) 45 of the first controllable gate 7, and connected by a control input 46 thereof to the output 22 of the square wave generator 21;
a second (additional) controllable switch 47 connected by one (first) input 48 thereof to the negative terminal 20 of the LDCVS 19, connected by a second input 51 thereof to the positive terminal 29 of the LDCVS 19, and connected by an output 49 thereof to an anode 50 of the first diode 30;
a square pulse duration converter 52 connected by an input 53 thereof to the output 22 of the square wave generator 21, connected by an output 54 thereof to a control input 55 of the second (additional) controllable switch 47, and connected by power inputs 56, 57 to respective outputs 29, 20 of the LDCVS 19.

Figure 2:
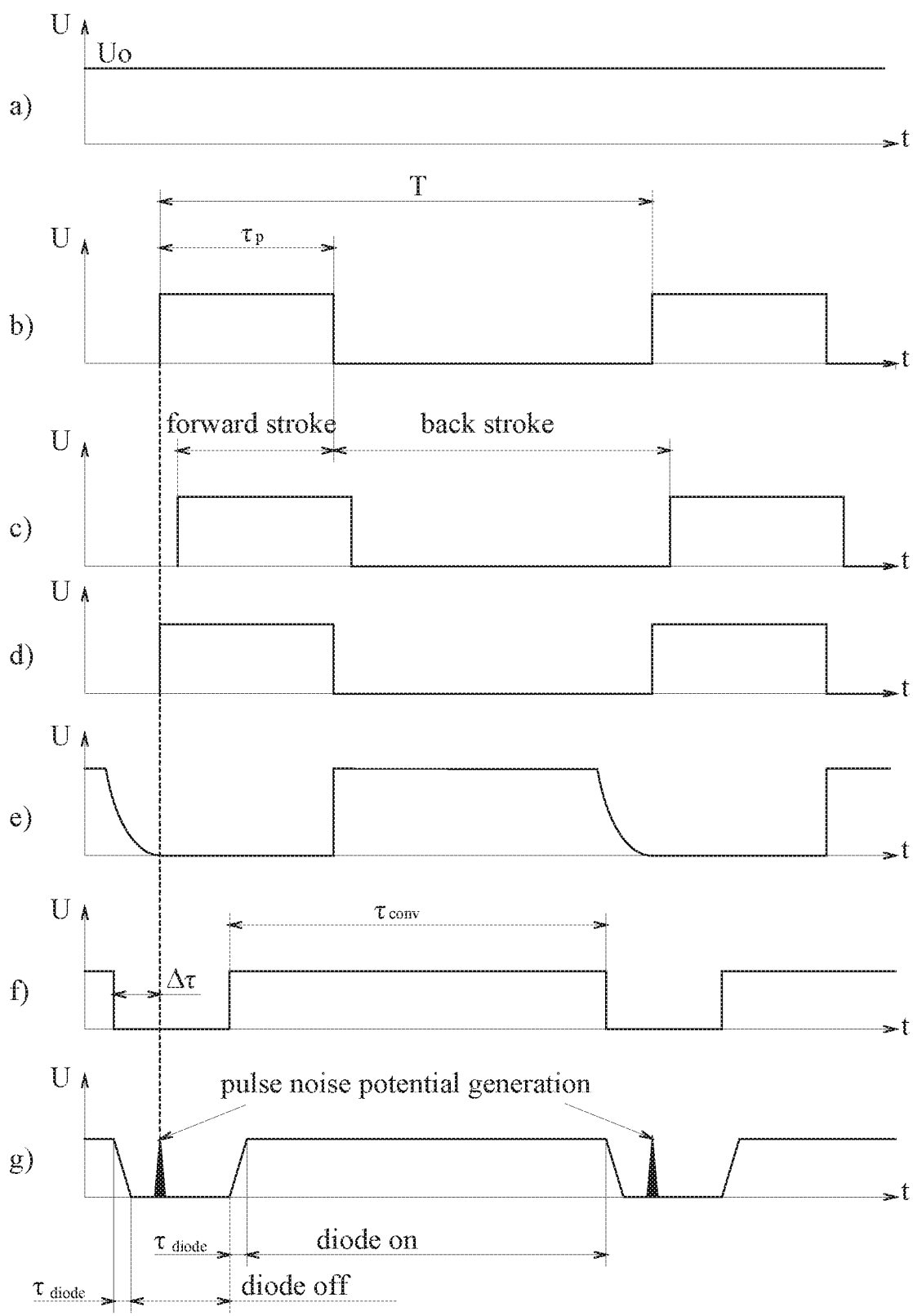

The charts of FIG. 2 of voltage acting in the apparatus illustrate:
(a)—constant voltage $U_0$ of the HDCVS 1;
(b)—control square pulses of preset duration $\tau_p$ and a pulse-repetition period of T at the output 22 of the square wave generator 21;
(c)—control square pulses at the input 26 (at the gate of the MOS-transistor) of the second controlled gate 12;
(d)—pulse voltage at the second terminal 11 of the first controlled gate 7 (at the MOS-transistor source);
(e)—pulse voltage at the first terminal 13 of the second controlled gate 12 (at the MOS-transistor drain);
(f)—converted (additional) square pulses of duration $\tau_{conv}$ at the output 54 of the square pulse duration converter 52, $\Delta\tau > \tau_{diode}$ where $\Delta\tau$—a duration of the protective time interval ensuring preceding connection of the anode 50 of the diode 30 to the negative terminal 20 of the LDCVS 19, and $\tau_{diode}$ is a switching time of the high voltage diode 30;
(g)—succession of states ("diode on"—"$\tau_{diode}$ (diode switching time)"—"diode off") of the first diode 30.

Chart (g) also shows conventionally a moment of pulse noise potential generation, present in prior art and absent in proposed design.

The proposed apparatus for generating high pulse voltage operates as follows.

Subject to having DC voltage at the power inputs 27, 28 of the square wave generator 21 which comes from the terminals 29, 20 of the LDCVS 19, the square wave generator 21 produces square pulses of duration $\tau_p$ and period of T (FIG. 2b).

Then, square pulses of duration $\tau_p$ pass from the output 22 of the generator 21 via the buffer matching stage 24 (input 23 and output 25) to the control input 26 of the second controlled gate 12 (to the MOS-transistor gate) (FIG. 2c) which results in closing the second controllable gate 12.

Simultaneously, square pulses of duration $\tau_p$ pass from the output 22 of the generator 21 to the control input 46 of first controlled switch 41. As a result, potential, exceeding potential of the second terminal 11 of the first controllable gate 7 (the source of the MOS-transistor) by value almost equal to output voltage of the LDCVS 19, passes to the control input 45 of the first controllable gate 7 (the gate of the MOS-transistor thereof) from the second (booster) capacitor 31.

Arrival of this potential closes the first controllable gate 7 almost simultaneously with the second controllable gate 12 (chart 2d) causing current to flow through the inductive load 9 along the circuit: the positive terminal 4 of the HDCVS 1—the closed first controllable gate 7—the inductive load 9—the closed second controllable gate 12—the limiting resistor 15—the negative terminal 6 of the HDCVS 1.

Closing the both controllable gates 7 and 12 causes potential of the first terminal 10 of the inductive load 9 to become almost equal to potential of the positive terminal 4 of the HDCVS 1 (because resistance of the closed first controllable gate 7 is negligible, and voltage drop thereon is also negligible) and causes potential of the second terminal 14 of the inductive load 9 to become almost equal to potential of the negative terminal 6 of the HDCVS 1 (because resistance of the closed second controllable gate 12 and the limiting resistor 15 is negligible, and voltage drop thereon is also negligible). Accordingly, potential difference between the terminals 10 and 14 of the inductive load 9 becomes close to output voltage of the HDCVS 1. At that moment, energy storing takes place in the inductive load (forward stroke, FIG. 2c).

After completion of square pulse of duration $\tau_p$ passing to the control input 45 of the first controlled gate 7 (to the gate of the MOS-transistor thereof) and, via the buffer matching stage 24, to the control input 26 of the second controlled gate 12 (to the gate of the MOS-transistor thereof), the both controllable gates 7 and 12 switch to open state (back stroke, FIG. 2c). At this moment, potential difference between the terminals 10 and 14 of the inductive load 9 changes sign thereof, pulse voltage emerges at the first terminal 13 of the second controlled gate 12 (at the drain of the MOS-transistor, FIG. 2e), self-induced emf emerges in the inductive load 9, and stored energy is passed to effective load (not shown). In this way, DC voltage of the HDCVS 1 (FIG. 2a) is converted into high pulse voltage.

Upon opening the first, 7, and second, 12, controllable gates, high voltage emerges between the terminals 10 and 14 of the inductive load 9 because of self-induced emf. As soon as this high voltage exceeds output voltage of the HDCVS 1, the second diode (first pick-off) 35 and the third (second pick-off) diode 38 open, and current starts flowing through them in the following circuit: the negative terminal 6 of the HDCVS 1—the second (first pick-off) diode 35—the inductive load 9—the third (second pick-off) diode 38—the first (storage) capacitor 2—the negative terminal 6 of the HDCVS 1. Consequently, in addition to energy delivery to effective load, storing energy in the storage capacitor 2 takes place (contributing to enhancing efficiency of both proposed design and the design-prototype which also uses this technique).

In addition to ensuring closing the both controllable gates 7 and 12, square pulses of duration $\tau_p$ from the output 22 of the square wave generator 21 also arrive at the control input 53 of the square pulse duration converter 52. At the output 54 thereof, a converted additional square pulse of duration $\tau_{conv}$ appears (FIG. 20 passing to the control input 55 of the second (additional) controlled switch 47.

Pulse of duration $\tau_{conv}$ causes coupling the output 49 (connected to the anode 50 of the first diode 30) of the second (additional) switch 47 to the second input 51 thereof (connected to the positive terminal 29 of the LDCVS 19). As a result, voltage close by value to output voltage of the LDCVS 19 emerges between the plates 32 and 34 of the second, booster, capacitor 31.

When the HDCVS 1 and LDCVS 19 are initially turned on, the second, booster, capacitor 31 is discharged, the first controllable gate 7 is permanently open, and the second controllable gate 12 is periodically closed by square pulses of duration $\tau_p$ coming to the control input 26 thereof from the output 22 of the square wave generator 21 via the buffer matching stage 24. In this mode, current charging the second, booster, capacitor 31 flows in the circuit: the positive terminal 29 of the LDCVS 19—the second controllable switch 47—the first, booster, diode 30—the second, booster, capacitor 31—the inductive load 9—the closed second controllable gate 12—the limiting resistor 15—the negative terminal 20 of the LDCVS 19.

On the other hand, in steady-state operation (where the both controllable gates 7 and 12 are almost simultaneously closed when main square pulse of duration $\tau_p$ acts and are open when it is absent), recharging of the second, boost, capacitor 31 and, hence, voltage recovery between the plates 32 and 34 thereof takes place. This process occurs during back stroke (FIG. 2c) due to current charging the second, booster, capacitor 31 in the circuit: the positive terminal 29 of the LDCVS 19—the second controllable switch 47—the first, booster, diode 30—the second, booster, capacitor 31—the first pick-off diode 35 (said earlier to be open during back stroke)—the negative terminal 20 of the LDCVS 19. That way, the second, booster, capacitor in steady-state operation recharges time after time up to voltage close to output voltage of the LDCVS 19, thus enabling closing the first controllable gate 7 in the next period T as described earlier.

After completion of control pulse of duration $\tau_{conv}$ (FIG. 2f) at the control input 55 of the second, additional, switch 47, the latter connects the first input 48 thereof (connected to the negative terminal 20 of the LDCVS 19) to the output 49 thereof (connected to the anode 50 of the first, booster, diode 30).

The first, booster, diode 30 becomes, therefore, non-conductive because potential of the second plate 34 of the second, booster, capacitor 31 at that time is close to potential of the negative terminal 20 of the LDCVS 19. Voltage between the plates 32 and 34 thereof is about output voltage of the LDCVS 19, i.e. voltage close to output voltage of the LDCVS 19 is applied to the cathode 33 of the first, booster, diode 30, whereas the anode 50 thereof turns out to be connected to the negative terminal 20 of the LDCVS 19, which means that the diode is connected reversely. Because of transit time of the first, booster, diode 30, it becomes non-conductive during time interval of $\tau_{diode}$ (FIG. 2g).

In the proposed apparatus for generating high pulse voltage, therefore, no in-rush current emerges through the incompletely closed first, booster, diode 30 when high voltage appears in the inductive load 9. In prior art designs of similar use, this in-rush current shows itself.

Therefore, the proposed design fulfils same functions as the design-prototype having advantage of it in decreased level of noise radiated into surrounding environment.

Functional units composing the apparatus can be implemented in different ways.

Used for the square wave generator 21, for example, can be a chip acting as PW modulator, such as A7985A, or PF modulator, such as FAN-6300H, etc.

For both, or each of, transistors of the first and second controllable gates 7 and 12, MOS-transistors or IGBT can be used, and gate itself can comprise additional technique improving operational quality thereof.

The inductive load 9 including a winding on a core can be either a primary winding of a transformer with a rectifier connected to a secondary winding thereof, or a coil of an electromagnet converting pulses in an inductive load into armature travel, or any other inductance delivering power to a terminal unit.

The pick-off diodes 35, 38 can include any unilateral conductivity device such as MOS-transistors, IGBT, etc.

The buffer stage 24, meant to match moments of feeding control pulses to the inputs of the first, 7, and second, 12, controllable gates, can include, for example, a delay element and an amplifier connected in series, or can be absent at all.

All other units composing the apparatus for generating high pulse voltage are well known in the art and described in public sources relating to pulse technique and radioelectronics.

The invention claimed is:

1. An apparatus for generating high pulse voltage, the apparatus comprising:
    a high DC voltage source (HDCVS);
    a first capacitor connected by a first plate thereof to a positive terminal of the HDCVS and connected by a second plate thereof to a negative terminal of the HDCVS;
    a first controllable gate connected by a first terminal thereof to the positive terminal of the HDCVS;
    an inductive load connected by a first terminal thereof to a second terminal of the first controllable gate;
    a second controllable gate connected by a first terminal thereof to a second terminal of the inductive load;
    a limiting resistor connected by one terminal thereof to a second terminal of the second controllable gate and connected by another terminal thereof to the negative terminal of the HDCVS;
    a low DC voltage source (LDCVS) connected by a negative terminal thereof to the negative terminal of the HDCVS;
    a square wave generator connected by an output thereof to a control input of the second controllable gate and connected by power inputs thereof to respective terminals of the LDCVS; a first diode; a second capacitor connected by a first plate thereof to a cathode of the first diode and connected by a second plate thereof to the second terminal of the first controllable gate; a second diode connected by a cathode thereof to the first terminal of the inductive load and connected by an anode thereof to the negative terminal of the HDCVS; a third diode connected by an anode thereof to the second terminal of the inductive load and connected by a cathode thereof to the positive terminal of the HDCVS; a controllable switch connected by a first input thereof to the first plate of the second capacitor, connected by a second input thereof to the second plate of the second capacitor, connected by an output thereof to a control input of the first controllable gate, and connected by a control input thereof to the output of the square wave generator, the apparatus further comprising a second controllable switch and a square pulse duration converter, the converter being connected by an input thereof to the output of the square wave generator and connected by an output thereof to a control input of the second controllable switch connected by a first input thereof to the negative terminal of the LDCVS, connected by a second input thereof to the positive terminal of the LDCVS and connected by an output thereof to an anode of the first diode.

2. The apparatus according to claim 1, wherein the connection between the output of the square wave generator and the control input of the second controllable gate is made via a buffer matching stage.

* * * * *